US006137731A

United States Patent [19]
Uchida et al.

[11] Patent Number: 6,137,731
[45] Date of Patent: Oct. 24, 2000

[54] SEMICONDUCTOR MEMORY INCLUDING AN INTERMEDIATE POTENTIAL CIRCUIT CAPABLE OF PROVIDING REDUCED CURRENT FLOW

[75] Inventors: Shouzou Uchida; Yukinori Yamada, both of Tokyo, Japan

[73] Assignee: NEC Corporation, Tokyo, Japan

[21] Appl. No.: 09/447,212

[22] Filed: Nov. 23, 1999

[30] Foreign Application Priority Data

Nov. 30, 1998 [JP] Japan .................................. 10-340426

[51] Int. Cl.[7] .................................................. G11C 16/04
[52] U.S. Cl. .................................. 365/189.05; 365/189.07
[58] Field of Search ........................ 365/189.05, 189.07, 365/189.01

[56] References Cited

U.S. PATENT DOCUMENTS

| | | | |
|---|---|---|---|
| 5,500,820 | 3/1996 | Nakaoka | 365/189.01 |
| 5,729,152 | 3/1998 | Leung et al. | 326/21 |
| 6,055,210 | 4/2000 | Setogawa | 365/233 |

*Primary Examiner*—David Nelms
*Assistant Examiner*—Hoai V. Ho
*Attorney, Agent, or Firm*—Sughrue, Mion, Zinn, Macpeak & Seas, PLLC

[57] ABSTRACT

A semiconductor memory enables establishment of intermediate electric potential of bus line to be implemented without flowing through current between a power-supply and ground. When a read-bus line 'RB' is of 'Low' state, high-pulse is outputted as an internal pulse signal 'RBEQ', then 'N'-type transistor N2 and 'P'-type transistor P2 become 'ON' state. Further, also 'N'-type transistor N5 becomes 'ON' state. Then, 'N'-type transistor N3 becomes 'OFF' state, 'N'-type transistor N4 becomes 'ON' state, also 'P'-type transistors P3, and P4 become 'ON' state. According to this situation, output of an inverter I2 becomes 'Low', 'P'-type transistor P1 becomes 'ON' state, 'N'-type transistor N1 becomes 'OFF' state, thus electric potential of the read-bus line 'RB' changes into 'High' from 'Low'. Subsequently, it makes signal 'RBEQ' 'Low', then, 'P'-type transistor P2 and 'N'-type transistor N2 become 'OFF' state so that the read-bus line 'RB' maintains intermediate potential level.

7 Claims, 4 Drawing Sheets

SEMICONDUCTOR MEMORY INCLUDING AN INTERMEDIATE POTENTIAL CIRCUIT CAPABLE OF PROVIDING REDUCED CURRENT FLOW

BACKGROUND OF THE INVENTION

The present invention relates to a semiconductor memory. More to particularly, this invention relates to a semiconductor memory which is provided with an intermediate electric potential establishment circuit causing electric potential of read bus line for transmitting signal from sense amplifier to data output circuit and write bus line for transmitting signal from data-in circuit to write amplifier to be established intermediate electric potential between 'High' level and 'Low' level.

DESCRIPTION OF THE PRIOR ART

In recent years, a market requires a semiconductor which is a product of large capacity and of multi-bit with high speed operation. However, when memory capacity increases, load capacity of internal circuit increases, thus avoidance of realization for high speed operation of the semiconductor memory occurs. In particular, increase of load capacity appears remarkably in a bus line (hereinafter, referred to as read bus line) for transmitting signal from a sense amplifier circuit to a data output circuit and a bus line (hereinafter, referred to as write bus line) for transmitting signal from a data-in circuit to a write amplifier circuit.

For that reason, many semiconductor memories are provided with an intermediate electric potential establishment circuit which causes electric potential of the read-bus line and the write-bus line to be established intermediate electric potential, immediately after the time when the sense amplifier circuit and the data-in circuit work in order to accelerate signal transfer speed of the read-bus line and the write-bus line.

In general, this intermediate electric potential establishment circuit has configuration shown in FIG. 1. In FIG. 1, 'RB' indicates a read bus line for transferring signal from sense amplifier circuit (not illustrated) to a data output circuit (hereinafter referred to as 'Dout buffer'). Further, 'RBEQ ' indicates control signal from 'ATD' (Address Transition Detector) circuit (not illustrated) generating pulse at the time of change of operation.

This intermediate electric potential establishment circuit comprises an inverter I1 inputting thereto the signal 'RBEQ' as an inversion signal, 'P' type transistor P1 and 'N' type transistor N1 whose gates and drains are connected to the read-bus line 'RB', 'P'-type transistor P2 which is connected to the 'P'-type transistor P1 in series, and whose source is connected to a power-supply, and whose gate is connected to output of the inverter I1 respectively, and 'N'-type transistor N2 which is connected to the 'N'-type transistor N1, whose source is connected to 'GND' and whose gate is connected to the signal 'RBEQ' respectively.

Next, there is described operation of the intermediate electric potential establishment circuit. Here, there is described the case the read-bus line 'RB' transferring the data from 'Low' to 'High'. FIG. 2 is a timing chart of the operation thereof.

Firstly, when the signal 'RBEQ' is 'Low', since the inverter I1 outputs 'High', the 'P'-type transistor P2 which inputs thereto the output of the inverter I1 as a gate input becomes 'OFF', and also the 'N'-type transistor N2 which inputs thereto the signal 'RBEQ' as a gate input becomes 'OFF'. Accordingly, the read-bus line 'RB' maintains 'Low' without reference to the status of the 'P'-type transistor P1 and the 'N'-type transistor N1.

Next, when the 'ATD' circuit (not illustrated) works, and the signal changes from 'Low' to 'High', the output of the inverter I1 changes into 'Low'. For that reason, both of the 'N'-type transistor N2 which inputs thereto the signal 'RBEQ' as a gate input and the 'P'-type transistor P2 which inputs thereto the output of the inverter I1 as a gate input become 'ON'. At this time, the 'N'-type transistor N1 which inputs thereto the read-bus line 'RB' as a gate input is 'OFF' because the gate input is 'Low'. The 'P'-type transistor P1 becomes 'ON' because the 'P'-type transistor P1's inputs of the drain and the gate become 'Low' and the power-supply is provided for the source through the 'P'-type transistor P2. An electric potential is provided from the power-supply for the read-bus line 'RB' through the 'P'-type transistors P1, P2, thus the electric potential of the read-bus line 'RB' is forced to be changed from 'Low' to 'High'. However, when the electric potential of the read-bus line 'RB' becomes more than the threshold value of the 'N'-type transistor N1, the 'N'-type transistor N1 which inputs thereto the electric potential of the read-bus line 'RB' as the gate input becomes 'ON'. For that reason, when the electric potential of the read-bus line 'RB' increases to certain value of the electric potential, current capability of the 'P'-type transistor P1 becomes the same as that of the 'N'-type transistor N1, and the electric potential becomes constant, thus the status is maintained until the signal 'RBEQ' changes into 'Low'. The electric potential of the read-bus line 'RB' at this time is settled according to ratio of the current capability of the 'P'-type transistor P1 and the 'N'-type transistor N1. Usually, in many cases, it is set so as to become ½ times of the power-supply.

When status of the signal 'RBEQ' changes into 'Low', as described previously, the 'P'-type transistor P2 and the 'N'-type-transistor N2 become 'OFF', the read-bus line 'RB' maintains the electric potential. However, when data is outputted from the sense amplifier circuit at this time, the read-bus line becomes 'High' with small electric potential variation.

As described above, the intermediate electric potential establishment circuit is used, and it causes the read-bus line 'RB' to be intermediate electric potential, immediately before the time when data output from the sense amplifier circuit is changed, therefore, it is capable of realizing high speed operation of the semiconductor memory.

Further, in the write-bus line, the operation thereof is approximately identical with the operation described above, here, there is described the case the write-bus line 'WB' transferring the data from 'Low' to 'High'.

Firstly, when the signal 'WBEQ' is 'Low', since the inverter I1 outputs 'High', the 'P'-type transistor P2 which inputs thereto the output of the inverter I1 as a gate input becomes 'OFF', and also the 'N'-type transistor N2 which inputs thereto the signal 'WBEQ' as a gate input becomes 'OFF'. Accordingly, the write-bus line 'WB' maintains 'Low' without reference to the status of the 'P'-type transistor P1 and the 'N'-type transistor N1.

Next, when the 'ATD' circuit (not illustrated) works, and the signal changes from 'Low' to 'High', the output of the inverter I1 changes into 'Low'. For that reason, both of the 'N'-type transistor N2 which inputs thereto the signal 'WBEQ' as a gate input and the 'P'-type transistor P2 which inputs thereto the output of the inverter I1 as a gate input become 'ON'. At this time, the 'N'-type transistor N1 which inputs thereto the write-bus line 'RB' as a gate input is 'OFF' because the gate input is 'Low'. The 'P'-type transistor P1 becomes 'ON' because the 'P'-type transistor P1's inputs of the drain and the gate become 'Low' and the power-supply is provided for the source through the 'P'-type transistor P2. An electric potential is provided from the power-supply for the write-bus line 'WB' through the 'P'-type transistors P1, P2, thus the electric potential of the write-bus line 'WB' is forced to be changed from 'Low' to 'High'. However, when the electric potential of the write-bus line 'WB' becomes more than the threshold value of the 'N'-type transistor N1, the 'N' type transistor N1 which inputs thereto the electric potential of the read-bus line 'RB' as the gate input becomes 'ON'. For that reason, when the electric potential of the write-bus line 'WB' increases to certain value of the electric potential, current capability of the 'P'-type transistor P1 becomes the same as that of the 'N'-type transistor N1, and the electric potential becomes constant, thus the status is maintained until the signal 'WBEQ' changes into 'Low'. The electric potential of the write-bus line 'WB' at this time is settled according to ratio of the current capability of the 'P'-type transistor P1 and the 'N'-type transistor N1. Usually, in many cases, it is set so as to become ½ times of the power-supply.

When status of the signal 'WBEQ' changes into 'Low', as described previously, the 'P'-type transistor P2 and the 'N'-type-transistor N2 become 'OFF', the write-bus line 'WB' maintains the electric potential. However, when data is outputted from the sense amplifier circuit at this time, the write-bus line becomes 'High' with small electric potential variation.

However, there occurs problem that operating current is increased in the conventional intermediate electric potential establishment circuit. In particular, in the case of multiple bits, since there are the read-bus line and the write-bus line in every bit, the number of the intermediate electric potential establishment circuit becomes large, thus increase of the operation current becomes remarkable.

Because, as described previously, the conventional intermediate electric potential establishment circuit causes both of the 'P'-type transistor and the 'N'-type transistor to be 'ON', and causing the read-bus line and the write-bus line to be established intermediate electric potential according to ratio of the current capability, therefore, the period 't' (FIG. 2) when the intermediate electric potential establishment circuit is 'ON', through current Ivg flows between the power-supply and the 'GND'.

SUMMARY OF THE INVENTION

In view of the foregoing, it is an object of the present invention, in order to overcome the above-mentioned problem to provide a semiconductor memory which causes the bus line into which through current between the power-supply and the 'GND' flows to be an intermediate electric potential.

A semiconductor memory of the present invention is provided with a electric potential comparison circuit, wherein when only during period where control signal of internal electric potential establishment circuit is 'High level', electric potential of read-bus line (write-bus line, write/read-bus line) is compared with a reference electric potential, then, the electric potential comparison circuit causes only one of either the first 'P'-type transistor or the first 'N'-type transistor to be 'ON'.

According to a first aspect of the present invention, in order to achieve the above-mentioned object, there is provided a semiconductor memory which includes an inverter for inverting a prescribed control signal, a first 'P'-type transistor and a first 'N'-type transistor whose drains are connected to a readbus line for transferring signal from a sense amplifier to a data output circuit, a second 'P'-type transistor which is connected to the first 'P'-type transistor in series, and whose source is connected to a power-supply, and whose gate is connected to an output of the inverter, and a second 'N'-type transistor which is connected to the first 'N'-type transistor in series, and whose source is connected to ground, and whose gate is connected to an input of the inverter, thus the control signal is inputted to the gate, in which the semiconductor memory comprises an intermediate electric potential establishment circuit wherein when the read-bus line transfers data from 'Low' to 'High', the intermediate electric potential establishment circuit causes the control signal to be changed from 'Low' to 'High', subsequently, when electric potential of the read-bus line becomes intermediate electric potential, the establishment circuit causes the control signal to be 'Low', thereby, causing electrical potential of the read-bus line to be intermediate electric potential, and an electric potential comparison circuit wherein electric potential of the read-bus line is compared with a reference electric potential only during period of time when the control signal is 'High Level', before causing only one of either the first 'P'-type transistor or the first 'N'-type transistor to be 'ON'.

According to a second aspect of the present invention, in the first aspect, there is provided a semiconductor memory, wherein the electric potential comparison circuit causes one of either the first 'N'-type transistor or the first 'P'-type transistor to be 'ON' only when electric potential of the reference electric potential differs from electric potential of the read-bus line.

According to a third aspect of the present invention, in the second aspect, there is provided a semiconductor memory, wherein the electric potential comparison circuit comprises a third 'N'-type transistor whose gate is connected to the read-bus line, a third 'P'-type transistor whose source is connected to a power-supply, and whose drain is connected to a drain of the third 'N'-type transistor, a fourth 'N'-type transistor whose gate is connected to the reference electric potential, a fourth 'P'-type transistor whose source is connected to the power-supply, whose gate is connected to a gate of the third 'P'-type transistor, and whose drain is connected to a drain of the fourth 'N'-type transistor, and whose gate and drain are connected with each other, a fifth 'N'-type transistor whose source is connected to the ground, and whose drain is connected to sources of the third and the fourth 'N'-type transistors, thus the control signal is inputted to a gate thereof, and an inverter whose input is connected to drains of the third 'P'-type and the third 'N'-type transistors, and whose output is connected to gates of the first 'P'-type and the first 'N'-type transistors.

As stated-above, when the gate electric potential of the third and the fourth 'P'-type transistors decrease, the third and the fourth 'P'-type transistors become 'ON', so that electric potential of a node becomes 'High'. The fourth and the fifth 'N'-type transistors cause electric potential of a drain of the fourth 'P'-type transistor to be 'Low' through the fourth and the fifth 'N'-type transistors, therefore, gate electric potential of the third and the fourth 'P'-type transistors maintain 'Low'. For that reason, the second inverter which inputs thereto electric potential of the node outputs 'Low'. The first 'P'-type transistor which inputs thereto this 'low' as a gate input, becomes 'ON', and the first 'N'-type transistor becomes 'OFF', thus, the read-bus line changes into 'High' from 'Low' through the second and the first 'P'-type transistors. However, it is set that the semiconductor memory cause the internal pulse signal to be 'Low' when the read-bus line comes to intermediate potential level, accordingly, the second 'P'-type transistor and the second 'N'-type transistor which input thereto the signal as the gate input become 'OFF', thus the read-bus line maintains electric potential with intermediate electric potential level. Subsequently, electric potential of the read-bus line changes into either 'High' or 'Low' from the intermediate electric potential according to output from the sense amplifier circuit. For that reason, it is capable of being obtained the same effect as that of the conventional system, and it is capable of interrupting current flowing between the power-supply and the 'GND'.

According to a fourth aspect of the present invention, there is provided a semiconductor memory which includes an inverter for inverting a prescribed control signal, a first 'P'-type transistor and a first 'N'-type transistor whose drains are connected to a write-bus line for transferring signal from a data-in circuit to a write amplifier circuit, a second 'P'-type transistor which is connected to the first 'P'-type transistor in series, and whose source is connected to a power-supply, and whose gate is connected to an output of the inverter, and a second 'N'-type transistor which is connected to the first 'N'-type transistor in series, and whose source is connected to ground, and whose gate is connected to an input of the inverter, thus the control signal is inputted to the gate, in which the semiconductor memory comprises an intermediate electric potential establishment circuit wherein when the write-bus line transfers data from 'Low' to 'High', the intermediate electric potential establishment circuit causes the control signal to be changed from 'Low' to 'High', subsequently, when electric potential of the write-bus line becomes intermediate electric potential, the establishment circuit causes the control signal to be 'Low', thereby, causing electrical potential of the write-bus line to be intermediate electric potential, and an electric potential comparison circuit wherein electric potential of the write-bus line is compared with a reference electric potential only during period of time when the control signal is 'High Level', before causing only one of either the first 'P'-type transistor or the first 'N'-type transistor to be 'ON'.

According to a fifth aspect of the present invention, in the fourth aspect, there is provided a semiconductor memory, wherein the electric potential comparison circuit causes one of either the first 'N'-type transistor or the first 'P'-type transistor to be 'ON' only when electric potential of the reference electric potential differs from electric potential of the write-bus line.

According to a sixth aspect of the present invention, in the fifth aspect, there is provided a semiconductor memory, wherein the electric potential comparison circuit comprises a third 'N'-type transistor whose gate is connected to the read-bus line, a third 'P'-type transistor whose source is connected to a power-supply, and whose drain is connected to a drain of the third 'N'-type transistor, a fourth 'N'-type transistor whose gate is connected to the reference electric potential, a fourth 'P'-type transistor whose source is connected to the power-supply, whose gate is connected to a gate of the third 'P'-type transistor, and whose drain is connected to a drain of the fourth 'N'-type transistor, and whose gate and drain are connected with each other, a fifth 'N'-type transistor whose source is connected to the ground, and whose drain is connected to sources of the third and the fourth 'N'-type transistors, thus the control signal is inputted to a gate thereof, and an inverter whose input is connected to drains of the third 'P'-type and the third 'N'-type transistors, and whose output is connected to gates of the first 'P'-type and the first 'N'-type transistors.

As stated above, when the gate electric potential of the third and the fourth 'P'-type transistors decrease, the third and the fourth 'P'-type transistors become 'ON', so that electric potential of a node becomes 'High'. The fourth and the fifth 'N'-type transistors cause electric potential of a drain of the fourth 'P'-type transistor to be 'Low' through the fourth and the fifth 'N'-type transistors, therefore, gate electric potential of the third and the fourth 'P'-type transistors maintain 'Low'. For that reason, the second inverter which inputs thereto electric potential of the node outputs 'Low'. The first 'P'-type transistor which inputs thereto this 'low' as a gate input, becomes 'ON', and the first 'N'-type transistor becomes 'OFF', thus, the write-bus line changes into 'High' from 'Low' through the second and the first 'P'-type transistors. However, it is set that the semiconductor memory cause the internal pulse signal to be 'Low' when the write-bus line comes to intermediate potential level, accordingly, the second 'P'-type transistor and the second 'N'-type transistor which input thereto the signal as the gate input become 'OFF', thus the write-bus line maintains electric potential with intermediate electric potential level. Subsequently, electric potential of the write-bus line changes into either 'High' or 'Low' from the intermediate electric potential according to output from the write amplifier circuit. For that reason, it is capable of being obtained the same effect as that of the conventional system, and it is capable of interrupting current flowing between the power-supply and the 'GND'.

According to a seventh aspect of the present invention, there is provided a semiconductor memory which comprises an intermediate electric potential establishment circuit which includes a first 'N'-type transistor and a first 'P'-type transistor whose respective drains are connected to a write/readbus line which uses a read-bus line for transferring signal from a sense amplifier to a data output circuit and a write-bus line for transferring signal from a data-in circuit to a write amplifier circuit in common, a second 'P'-type transistor which is connected to the first 'P'-type transistor in series, and whose source is connected to a power-supply, and a second 'N'-type transistor which is connected to the second 'P'-type transistor in series, and whose source is connected to the ground, a third 'N'-type transistor whose gate is connected to the write/read-bus line, a third 'P'-type transistor whose source is connected to a power-supply, and whose drain is connected to a drain of the third 'N'-type transistor, a fourth 'N'-type transistor whose gate is connected to a reference electric potential, a fourth 'P'-type transistor whose source is connected to the power-supply, whose gate is connected to a gate of the third 'P'-type transistor, whose drain is connected to a drain of the fourth 'N'-type transistor, and whose gate and drain are connected with each other, a fifth 'N'-type transistor whose source is connected to the ground, whose drain is connected to respective sources of the third 'N'-type and the fourth 'N'-type transistors, a first inverter whose input is connected to the drain of the third 'N'-type transistor, and whose output is connected to respective gates of the first 'P'-type and the first 'N'-type transistors, a second inverter whose output is connected to respective gates of the second 'N'-type and the fifth 'N'-type transistors, a latch circuit, a transfer switch provided between the write/read-bus line and an input of the latch circuit performing 'ON'/'OFF' according to input/output of the second inverter, an exclusive-OR circuit which inputs thereto electric potential of the write/read-bus line and output of the latch circuit, a third inverter for inverting output of the exclusive-OR circuit, and a NAND circuit which inputs thereto prescribed control signal and output of the third inverter, and whose output is connected to a gate of the second 'P'-type transistor and an input of the second inverter.

As stated above, when the electric potential of the write/read-bus line becomes the intermediate electric potential, an input from the write/read-bus line becomes 'High' in relation to the output 'Low' of the latch circuit, thus the exclusive-OR circuit outputs 'High' so that the signal becomes 'Low' through the sixth inverter. Since the signal becomes 'Low', output of the NAND circuit changes into 'High' output from 'Low' output, so that the aspect causes operation of the electric potential comparison circuit and the intermediate electric potential establishment circuit to be stopped to maintain intermediate electric potential. Pulse width of the internal pulse signal becomes long, because of adoption of this system, with the result that it is capable of being prevented that electric potential of the write/read-bus line increases excessively or decreases excessively, thus there occurs advantage that adjustment of the pulse width of the internal pulse signal is capable of being implemented easily.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of the present invention will now be described in detail in accordance with the accompanying drawings.

Figure 1:
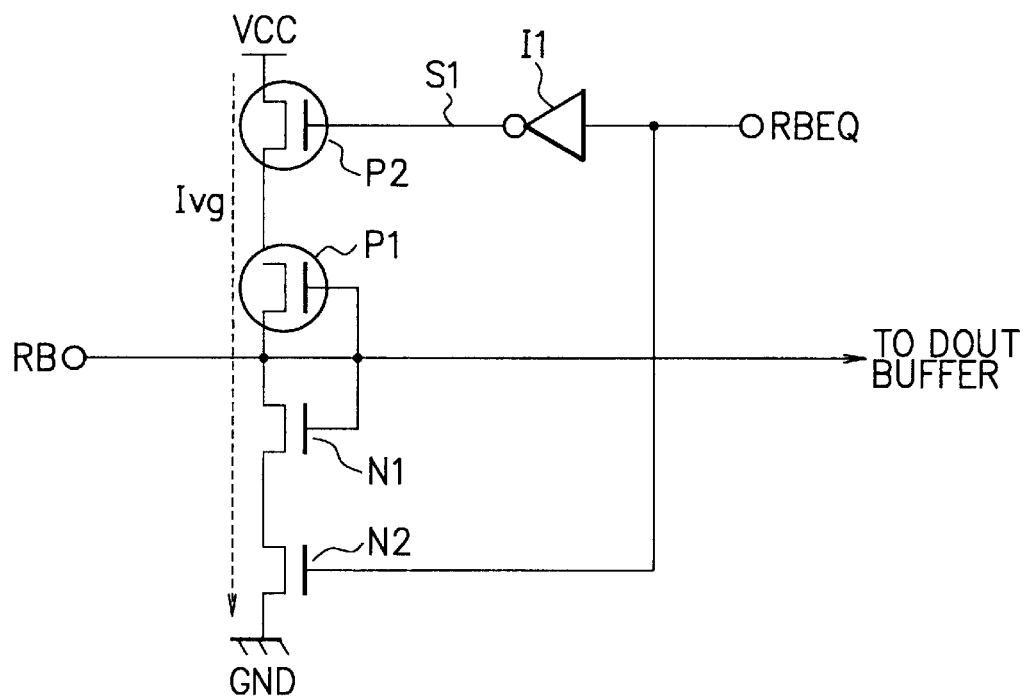
FIG. 1 is a circuit view of the conventional example.
Figure 2:
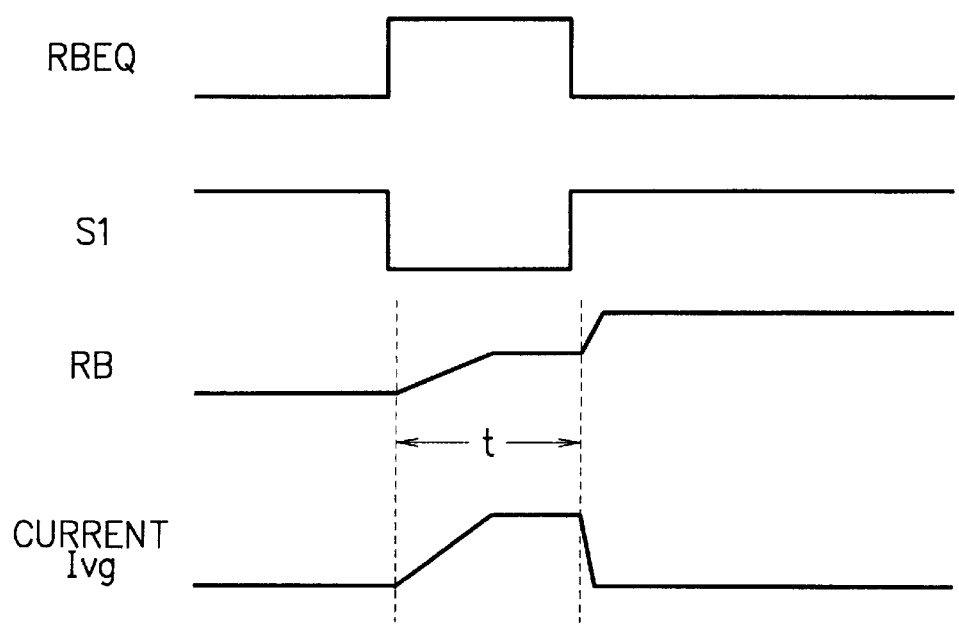
FIG. 2 is a timing chart for explaining operation of the circuit of FIG. 1.
Figure 3:
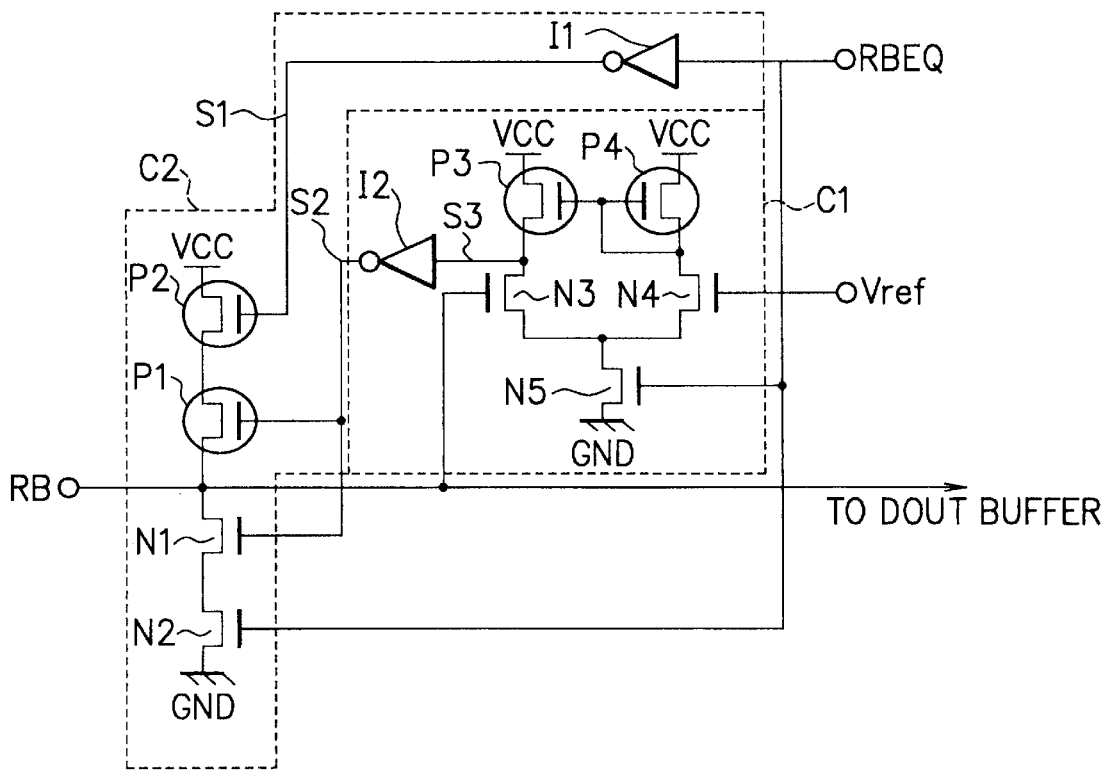
FIG. 3 is a circuit view showing principal part of a semiconductor memory according to a first embodiment of the present invention.

Referring to FIG. 3, a semiconductor memory of a first embodiment of the present invention is provided with an intermediate electric potential establishment circuit C2, and an electric potential comparison circuit C1.

The intermediate electric potential establishment circuit C2 causes a read-bus line 'RB' to be established an intermediate electric potential as being 'High' and 'Low' therebetween. The read-bus line transfers signal from a sense amplifier circuit not illustrated in FIG. 3, to a 'Dout buffer'. The intermediate electric potential establishment circuit C2 comprises a 'P'-type transistor P2 whose source is connected to a power-supply VCC, and whose gate is connected to a signal S1 obtained in such a way that an internal pulse signal 'RBEQ' is inverted by an inverter I1, a 'P'-type transistor P1 which is connected to a drain of the 'P'-type transistor P2 in series, and whose gate is connected to a signal S2, an 'N'-type transistor N2 whose source is connected to 'GND', and whose gate is connected to the signal 'RBEQ', and an 'N'-type transistor N1 which is connected to a drain of the 'N'-type transistor N2, and whose gate is connected to the signal S2, in addition, drains of both of the 'N'-type transistor N1 and the 'P'-type transistor P1 are connected to the read-bus line 'RB'.

The electric potential comparison circuit C1 comprises 'P'-type transistors P3, P4 whose sources are connected to the power-supply VCC, and whose gates are connected with each other, an 'N'-type transistor N4 whose gate is connected to reference electric potential 'Vref', and whose drain is connected to a gate and a drain of the 'P'-type transistor P4, an 'N'-type transistor N3 whose gate is connected to the read-bus line 'RB', and whose drain is connected to a drain of the 'P'-type transistor P3, an 'N'-type transistor N5 whose source is connected to 'GND' and whose drain is connected to sources of the 'N'-type transistors N3, N4, and which inputs therein the internal pulse signal 'RBEQ' as a gate input, and an inverter I2 which inputs thereto an electric potential of a node S3, and whose output S2 is connected to gates of the 'P'-type transistor P1 and the 'N'-type transistor N1 within the intermediate electric potential forming circuit C2, wherein the electric potential comparison circuit C1 receives the internal pulse signal 'RBEQ' to operate only during period of the pulse.

Figure 4:
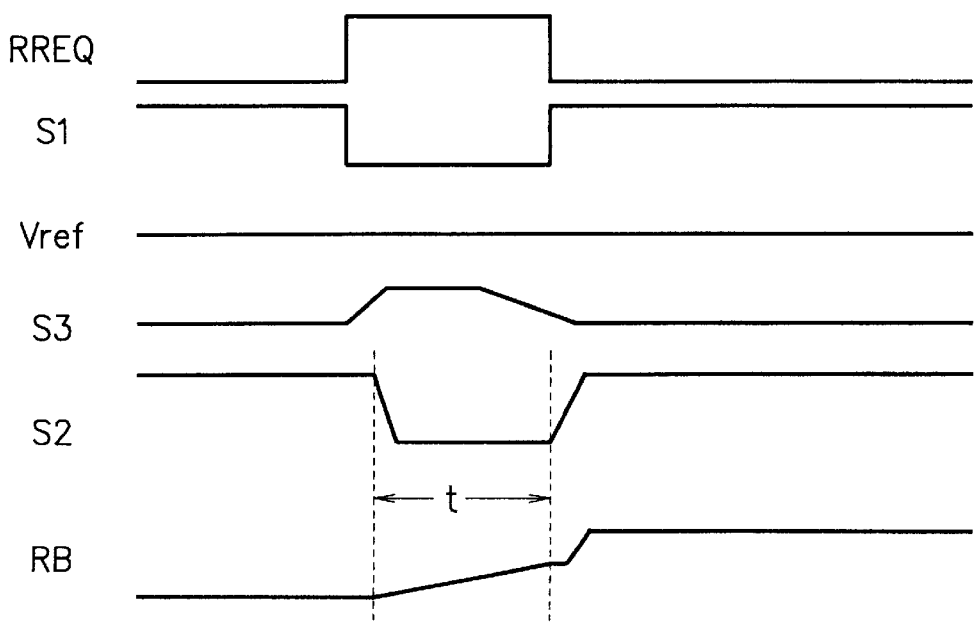
FIG. 4 is a timing chart for explaining operation of the circuit of FIG. 3.

Next, operation of the present embodiment will be described referring to FIGS. 3, 4 about the case where the read-bus line 'RB' is 'Low' state. Firstly, a high pulse shown in FIG. 4 as the internal pulse signal 'RBEQ ' is outputted, before data is outputted from the sense amplifier circuit. The inverter I1 inputs thereto the internal pulse signal 'RBEQ' before outputting 'Low-pulse ' as the signal S1 as shown in FIG. 4. The 'N'-type transistor N2 and the 'P'-type transistor P2 which input thereto the above-described signal 'RBEQ' and S1 as the gate input become 'ON' condition within the period. Further, the 'N'-type transistor N5 within the electric potential comparison circuit C1 which receives the signal 'RBEQ' becomes 'ON' condition. At this time, since the read-bus line 'RB' is the 'Low' condition, input of the 'N'-type transistor N3 becomes 'Low', thus the 'N'-type transistor N3 is 'OFF'. However, the 'N'-type transistor N4 which inputs thereto the reference electric potential 'Vref' as gate input becomes 'ON' because the 'N'-type transistor N5 is 'ON' and whose source is 'GND' level, thus the 'N'-type transistor N4 functions so as to decrease gate electric potential of the 'P'-type transistors P3, P4. When the gate electric potential of the 'P'-type transistors P3, P4 decrease, the 'P'-type transistors P3, P4 become 'ON', so that electric potential of node S3 becomes 'High' as shown in FIG. 4. The 'N'-type transistors N4 and N5 cause electric potential of a drain of the 'P'-type transistor P4 to be 'Low' through the 'N'-type transistor N4 and N5, therefore, gate electric potential of the 'P'-type transistors P3 and P4 maintain 'Low'. For that reason, the inverter I2 which inputs thereto electric potential of the node S3 outputs 'Low'. The 'P'-type transistor P1 which inputs thereto this 'low' as a gate input, becomes 'ON', and the 'N'-type transistor N1 becomes 'OFF', thus as shown in FIG. 4, the read-bus line 'RB' changes into 'High' from 'Low' through the 'P'-type transistors P2, and P1. However, it is set that the semiconductor memory causes the internal pulse signal 'RBEQ' to be 'Low' when the read-bus line 'RB' comes to intermediate potential level, accordingly, the 'P'-type transistor P2 and the 'N'-type transistor N2 which input thereto the signal 'RBEQ' as the gate input become 'OFF', thus the read-bus line 'RB' maintains electric potential with intermediate electric potential level. Subsequently, electric potential of the read-bus line 'RB' changes into either 'High' or 'Low' from the intermediate electric potential according to output from the sense amplifier circuit. For that reason, it is capable of being obtained the same effect as that of the conventional system, and it is capable of interrupting current flowing between the power-supply and the 'GND'.

Figure 5:
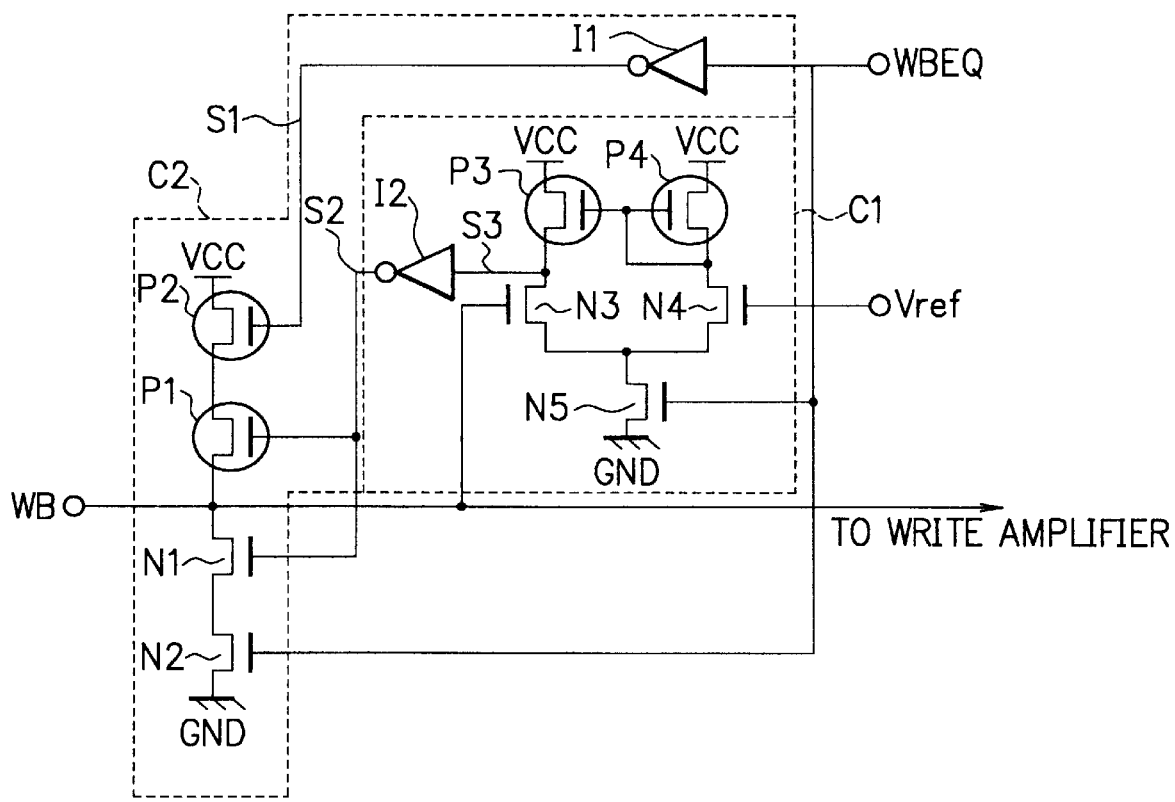
FIG. 5 is a circuit view of a semiconductor memory according to a second embodiment of the present invention.
Figure 6:
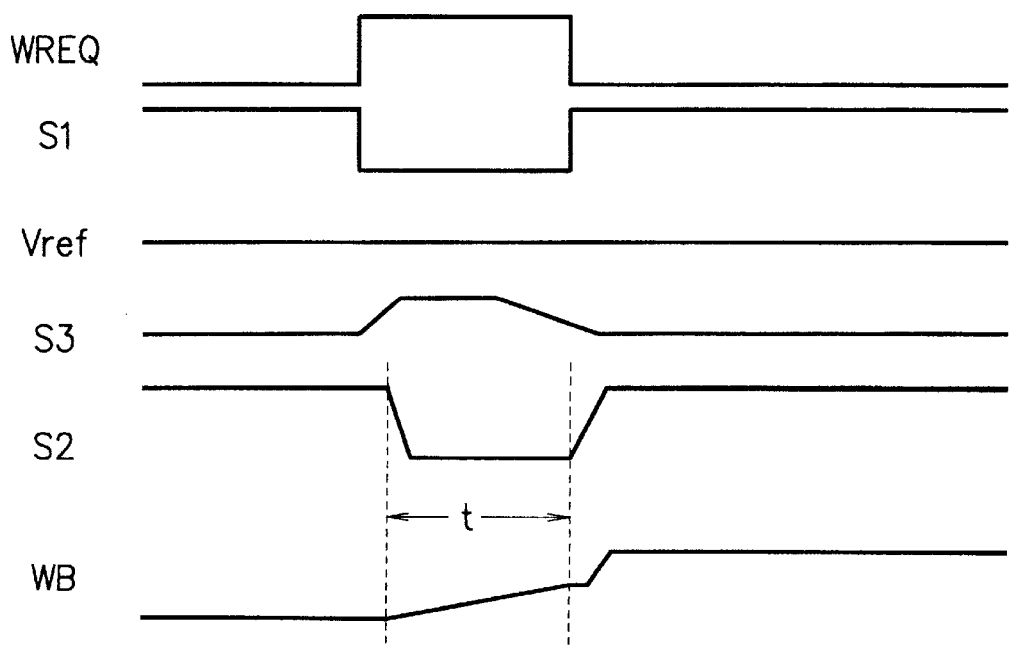
FIG. 6 is a timing chart for explaining operation of the circuit of FIG. 5.

FIG. 5 is a circuit view showing a semiconductor memory provided with an intermediate electric potential establishment circuit of a write-bus line 'WB' as a second embodiment of the present invention. FIG. 6 is a timing chart thereof.

Referring to FIG. 5, a semiconductor memory of a second embodiment of the present invention is provided with an intermediate electric potential establishment circuit C2, and an electric potential comparison circuit C1, which is the same as that of the first embodiment.

The intermediate electric potential establishment circuit C2 causes a write-bus line 'WB' to be established to an intermediate electric potential as being 'High' level and 'Low' level of electric potential therebetween. The write-bus line transfers signal from a sense amplifier circuit not illustrated in FIG. 5, to a 'write amplifier'. The intermediate electric potential establishment circuit C2 comprises a 'P'-type transistor P2 whose source is connected to a power-supply VCC, and whose gate is connected to a signal S1 obtained in such a way that an internal pulse signal 'WBEQ' is inverted by an inverter I1, a 'P'-type transistor P1 which is connected to a drain of the 'P'-type transistor P2 in series, and whose gate is connected to a signal S2, an 'N'-type transistor N2 whose source is connected to 'GND', and whose gate is connected to the signal 'WBEQ', and an 'N'-type transistor N1 which is connected to a drain of the 'N'-type transistor N2, and whose gate is connected to the signal S2, in addition, drains of both of the 'N'-type transistor N1 and the 'P'-type transistor P1 are connected to the write-bus line 'WB'.

The electric potential comparison circuit C1 comprises 'P'-type transistors P3, P4 whose sources are connected to the power-supply VCC, and whose gates are connected with each other, an 'N'-type transistor N4 whose gate is connected to reference electric potential Vref, and whose drain is connected to a gate and a drain of the 'P'-type transistor P4, an 'N'-type transistor N3 whose gate is connected to the write-bus line 'WB', and whose drain is connected to a drain of the 'P'-type transistor P3, an 'N'-type transistor N5 whose source is connected to 'GND' and whose drain is connected to sources of the 'N'-type transistors N3, N4, and which inputs thereto the internal pulse signal 'WBEQ' as a gate input, and an inverter I2 which inputs thereto an electric potential of a node S3, and whose output S2 is connected to gates of the 'P'-type transistor P1 and the 'N'-type transistor N1 within the intermediate electric potential forming circuit C2, wherein the electric potential comparison circuit C1 receives the internal pulse signal 'WBEQ' to operate only during period of the pulse.

Next, operation of the present embodiment will be described referring to FIGS. 5, and 6 about the case where the write-bus line 'WB' is 'Low' state. Firstly, a high pulse shown in FIG. 6 as the internal pulse signal 'WBEQ' is outputted before data is outputted from the sense amplifier circuit. The inverter I1 inputs thereto the internal pulse signal 'WBEQ' before outputting 'Low-pulse' as the signal S1 as shown in FIG. 6. The 'N'-type transistor N2 and the 'P'-type transistor P2 which input thereto the above-described signal 'WBEQ' and S1 as the gate input become 'ON' condition within the period. Further, the 'N'-type transistor N5 within the electric potential comparison circuit C1 which receives the signal 'WBEQ' becomes 'ON', condition. At this time, since the write-bus line 'WB' is the 'Low' condition, input of the 'N'-type transistor N3 becomes 'Low', thus the 'N'-type transistor N3 is 'OFF'. However, the 'N'-type transistor N4 which inputs thereto the reference electric potential Vref as gate input becomes 'ON' because the 'N'-type transistor N5 is 'ON' and whose source is 'GND' level, thus the 'N'-type transistor N4 functions so as to decrease gate electric potential of the 'P'-type transistors P3, P4. When the gate electric potential of the 'P'-type transistors P3, P4 decrease, the 'P'-type transistor P3, P4 become 'ON', so that electric potential of node S3 becomes 'High' as shown in FIG. 6. The 'N'-type transistors N4 and N5 cause electric potential of a drain of the 'P'-type transistor P4 to be 'Low' through the 'N'-type transistor N4 and N5, therefore, gate electric potential of the 'P'-type transistors P3 and P4 maintains 'Low'. For that reason, the inverter I2 which inputs thereto electric potential of the node S3 outputs 'Low'. The 'P'-type transistor P1 which inputs thereto this 'low' as a gate input, becomes 'ON', and the 'N'-type transistor N1 becomes 'OFF', thus as shown in FIG. 6, the write-bus line 'WB' changes into 'High' from 'Low' through the 'P'-type transistors P2, and P1. However, it is set that the semiconductor memory cause the internal pulse signal 'WBEQ' to be 'Low' when the write-bus line 'WB' comes to intermediate potential level, accordingly, the 'P'-type transistor P2 and the 'N'-type transistor N2 which input thereto the signal 'WBEQ' as the gate input become 'OFF', thus the write-bus line 'WB' maintains electric potential with intermediate electric potential level. Subsequently, electric potential of the write-bus line 'WB' changes into either 'High' or 'Low' from the intermediate electric potential according to output from the sense amplifier circuit. For that reason, it is capable of being obtained the same effect as that of the conventional system, and it is capable of interrupting current flowing between the power-supply and the 'GND'.

Figure 7:
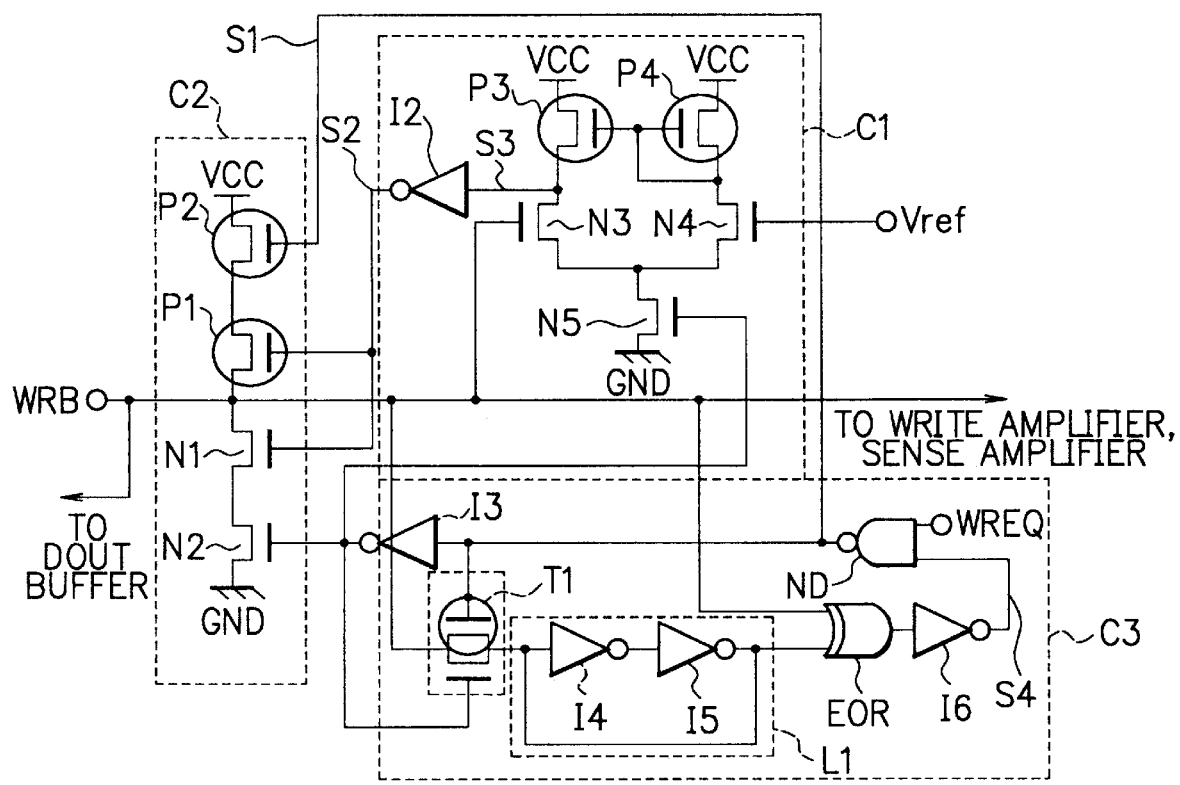
FIG. 7 is a circuit view of a semiconductor memory according to a third embodiment of the present invention.
Figure 8:
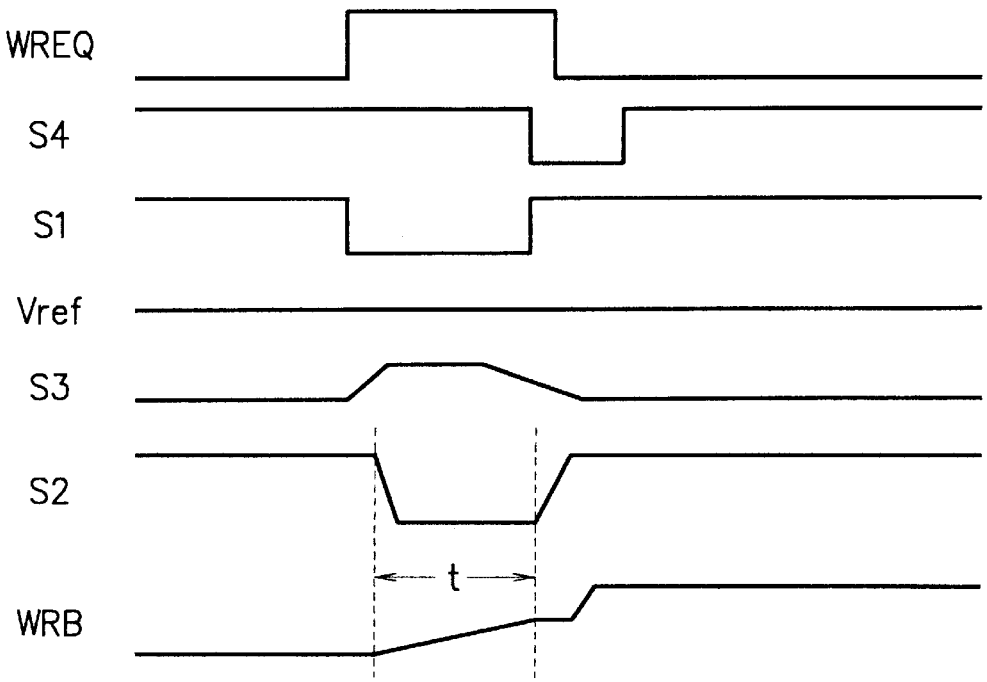
FIG. 8 is a timing chart for explaining operation of the circuit of FIG. 7.

FIG. 7 shows a third embodiment of the present invention. In the third embodiment, the read-bus line and the write-bus line are used in common (hereinafter, referred to as write/read-bus line 'WRB'). There is provided a control circuit C3 which senses the internal pulse signal 'WREQ' and change of electric potential of the write/read-bus line 'WRB' in order to control the electric potential comparison circuit C1 and the intermediate electric potential establishment circuit, and which is added to the circuit of FIG. 3.

The control circuit C3 comprises a transfer switch T1, a latch circuit L1 in which an inverter I4 is connected to an inverter I5 in series, and an output of the inverter I5 is inputted to a gate of the inverter 14, an exclusiveOR circuit 'EOR' which inputs thereto an output of the latch circuit Li and signal of the write/read-bus line 'WRB', an inverter I6 for inverting an output of the exclusive-OR circuit 'EOR', and an inverted AND circuit (NAND circuit) ND which inputs thereto an output S4 of the inverter I6 and an internal pulse signal 'WREQ' as inputs, and whose output is connected to a gate of the 'P'-type transistor P2 and the input of the inverter I3.

Next, there will be described operation of the third embodiment briefly.

When the internal pulse signal 'WREQ' changes into 'High' from 'Low', the electric potential comparison circuit C1 and the intermediate electric potential establishment circuit C2 work in order to change electric potential of the write/read-bus line 'WRB' into intermediate electric potential similar to the above described embodiment. At this time, the transfer switch T1 becomes 'OFF' while receiving signal S1 and signal obtained by inverting the signal S1. For that reason, the latch circuit L1 becomes maintaining initial electric potential of the write/read-bus line 'VRB', thus the latch circuit L1 inputs 'Low' to the exclusive-OR circuit 'EOR'. Concerning the write/read-bus line 'WRB', the signal S4 is 'High' because of 'Low' input firstly. Subsequently, when the electric potential of the write/read-bus line 'WRB' becomes the intermediate electric potential, an input from the write/read-bus line 'WRB' becomes 'High' in relation to the output 'Low' of the latch circuit L1, thus the exclusive-OR circuit 'EOR' outputs 'High' so that the signal S4 becomes 'Low' through the inverter 16. Since the signal S4 becomes 'Low', output of the NAND circuit 'ND' changes into 'High' output from 'Low' output, so that the third embodiment causes operation of the electric potential comparison circuit C1 and the intermediate electric potential establishment circuit C2 to be stopped to maintain intermediate electric potential.

Pulse width of the internal pulse signal 'WREQ' becomes long, because of adoption of this system, with the result that it is capable of being prevented that electric potential of the write/read-bus line 'WRB' increases excessively or decreases excessively, thus there occurs advantage that adjustment of the pulse width of the internal pulse signal 'WREQ' is capable of being implemented easily.

As described above, according to the present invention, it compares electric potential of either the read-bus line or the write-bus line with reference electric potential, and there is provided the electric potential comparison circuit for implementing control that it causes only one of either 'P'-type transistor or 'N'-type transistor within the intermediate electric potential establishment circuit to be 'ON', therefore, it is capable of being reduced current flowing between the power-supply and the 'GND'.

While preferred embodiments of the invention have been described using specific terms, such description is for illustrative purpose only, and it is to be understood that changes and variations may be made without departing from the spirit or scope of the following claims.

What is claimed is:

1. A semiconductor memory including:
   an inverter for inverting a prescribed control signal;
   a first 'P'-type transistor and a first 'N'-type transistor whose drains are connected to a read-bus line for transferring signal from a sense amplifier to a data output circuit;
   a second 'P'-type transistor which is connected to said first 'P'-type transistor in series, and whose source is connected to a power-supply, and whose gate is connected to an output of said inverter; and
   a second 'N'-type transistor which is connected to said first 'N'-type transistor in series, and whose source is connected to ground, and whose gate is connected to an input of said inverter, thus said control signal is inputted to said gate,
   said semiconductor memory comprising:
   an intermediate electric potential establishment circuit wherein when said read-bus line transfers data from 'Low' to 'High', said intermediate electric potential establishment circuit causes said control signal to be changed from 'Low' to 'High', subsequently, when electric potential of said read-bus line becomes intermediate electric potential, said establishment circuit causes said control signal to be 'Low', thereby, causing electrical potential of said read-bus line to be intermediate electric potential; and
   an electric potential comparison circuit wherein electric potential of said read-bus line is compared with a reference electric potential only during period of time when said control signal is 'High Level', before causing only one of either said first 'P' -type transistor or said first 'N'-type transistor to be 'ON'.

2. A semiconductor memory claimed in claim 1, wherein said electric potential comparison circuit causes one of either said first 'N'-type transistor or said first 'P'-type transistor to be 'ON' only when electric potential of said reference electric potential differs from electric potential of said read-bus line.

3. A semiconductor memory claimed in claim 2, wherein said electric potential comparison circuit comprises:
   a third 'N'-type transistor whose gate is connected to said read-bus line;
   a third 'P'-type transistor whose source is connected to a power-supply, and whose drain is connected to a drain of said third 'N'-type transistor;
   a fourth 'N'-type transistor whose gate is connected to said reference electric potential;
   a fourth 'P'-type transistor whose source is connected to said power supply, whose gate is connected to a gate of said third 'P'-type transistor, and whose drain is connected to a drain of said fourth 'N'-type transistor, and whose gate and drain are connected with each other;
   a fifth 'N'-type transistor whose source is connected to the ground, and whose drain is connected to sources of said third and said fourth 'N'-type transistors, thus said control signal is inputted to a gate thereof; and
   an inverter whose input is connected to drains of said third 'P'-type and said third 'N'-type transistors, and whose output is connected to gates of said first 'P'-type and said first 'N'-type transistors.

4. A semiconductor memory including:
   an inverter for inverting a prescribed control signal;
   a first 'P'-type transistor and a first 'N'-type transistor whose drains are connected to a write-bus line for transferring signal from a data-in circuit to a write amplifier circuit;
   a second 'P'-type transistor which is connected to said first 'P'-type transistor in series, and whose source is connected to a power-supply, and whose gate is connected to an output of said inverter; and
   a second 'N'-type transistor which is connected to said first 'N'-type transistor in series, and whose source is connected to ground, and whose gate is connected to an input of said inverter, thus said control signal is inputted to said gate,
   said semiconductor memory comprising:
   an intermediate electric potential establishment circuit wherein when said write-bus line transfers data from 'Low' to 'High', said intermediate electric potential establishment circuit causes said control signal to be changed from 'Low' to 'High', subsequently, when electric potential of said write-bus line becomes intermediate electric potential, said establishment circuit causes said control signal to be 'Low', thereby, causing electrical potential of said write-bus line to be intermediate electric potential; and an electric potential comparison circuit wherein electric potential of said write-bus line is compared with a reference electric potential only during period of time when said control signal is 'High Level', before causing only one of either said first 'P'-type transistor or said first 'N'-type transistor to be 'ON'.

5. A semiconductor memory claimed in claim 4, wherein said electric potential comparison circuit causes one of either said first 'N'-type transistor or said first 'P'-type transistor to be 'ON' only when electric potential of said reference electric potential differs from electric potential of said write-bus line.

6. A semiconductor memory claimed in claim 5, wherein said electric potential comparison circuit comprises:

a third 'N'-type transistor whose gate is connected to said read-bus line;

a third 'P'-type transistor whose source is connected to a power-supply, and whose drain is connected to a drain of said third 'N'-type transistor;

a fourth 'N'-type transistor whose gate is connected to said reference electric potential;

a fourth 'P'-type transistor whose source is connected to said power supply, whose gate is connected to a gate of said third 'P'-type transistor, and whose drain is connected to a drain of said fourth 'N'-type transistor, and whose gate and drain are connected with each other;

a fifth 'N'-type transistor whose source is connected to the ground, and whose drain is connected to sources of said third and said fourth 'N'-type transistors, thus said control signal is inputted to a gate thereof; and an inverter whose input is connected to drains of said third 'P'-type and said third 'N'-type transistors, and whose output is connected to gates of said first 'P'-type and said first 'N'-type transistors.

7. A semiconductor memory comprising:

an intermediate electric potential establishment circuit which includes a first 'N'-type transistor and a first 'P'-type transistor whose respective drains are connected to a write/read-bus line which uses a read-bus line for transferring signal from a sense amplifier to a data output circuit and a write-bus line for transferring signal from a data-in circuit to a write amplifier circuit in common, a second 'P'-type transistor which is connected to said first 'P'-type transistor in series, and whose source is connected to a power-supply, and a second 'N'-type transistor which is connected to said second 'P'-type transistor in series, and whose source is connected to the ground;

a third 'N'-type transistor whose gate is connected to said write/read-bus line;

a third 'P'-type transistor whose source is connected to a power-supply, and whose drain is connected to a drain of said third 'N'-type transistor;

a fourth 'N'-type transistor whose gate is connected to a reference electric potential;

a fourth 'P'-type transistor whose source is connected to said power supply, whose gate is connected to a gate of said third 'P'-type transistor, whose drain is connected to a drain of said fourth 'N'-type transistor, and whose gate and drain are connected with each other;

a fifth 'N'-type transistor whose source is connected to said ground, whose drain is connected to respective sources of said third 'N'-type and said fourth 'N'-type transistors;

a first inverter whose input is connected to said drain of said third 'N'-type transistor, and whose output is connected to respective gates of said first 'P'-type and said first 'N'-type transistors;

a second inverter whose output is connected to respective gates of said second 'N'-type and said fifth 'N'-type transistors;

a latch circuit;

a transfer switch provided between said write/read-bus line and an input of said latch circuit performing 'ON'/'OFF' according to input/output of said second inverter;

an exclusive-OR circuit which inputs thereto electric potential of said write/read-bus line and output of said latch circuit;

a third inverter for inverting output of said exclusive-OR circuit; and a NAND circuit which inputs thereto prescribed control signal and output of said third inverter, and whose output is connected to a gate of said second 'P'-type transistor and an input of said second inverter.

* * * * *

UNITED STATES PATENT AND TRADEMARK OFFICE
CERTIFICATE OF CORRECTION

PATENT NO. : 6,137,731
DATED : October 24, 2000
INVENTOR(S) : Shouzou Uchida, et. al.

It is certified that error appears in the above-identified patent and that said Letters Patent is hereby corrected as shown below:

Column 10, line 60, delete "Li" insert --L1--.

Signed and Sealed this

First Day of May, 2001

Attest:

NICHOLAS P. GODICI

Attesting Officer   Acting Director of the United States Patent and Trademark Office